(12) United States Patent
Kojima et al.

(10) Patent No.: US 11,542,174 B2
(45) Date of Patent: Jan. 3, 2023

(54) FERRITE PARTICLES, RESIN COMPOSITIONS AND ELECTROMAGNETIC WAVE SHIELDING MATERIAL

(71) Applicant: POWDERTECH CO., LTD., Chiba (JP)

(72) Inventors: Takashi Kojima, Chiba (JP); Kazutaka Ishii, Chiba (JP); Takao Sugiura, Chiba (JP); Tetsuya Igarashi, Chiba (JP); Koji Aga, Chiba (JP)

(73) Assignee: POWDERTECH CO., LTD., Chiba (JP)

( * ) Notice: Subject to any disclaimer, the term of this patent is extended or adjusted under 35 U.S.C. 154(b) by 690 days.

(21) Appl. No.: 16/307,794

(22) PCT Filed: May 31, 2017

(86) PCT No.: PCT/JP2017/020229
§ 371 (c)(1),
(2) Date: Dec. 6, 2018

(87) PCT Pub. No.: WO2017/212997
PCT Pub. Date: Dec. 14, 2017

(65) Prior Publication Data
US 2019/0300379 A1   Oct. 3, 2019

(30) Foreign Application Priority Data
Jun. 7, 2016   (JP) ............... JP2016-113647

(51) Int. Cl.
*C01G 49/00* (2006.01)
*C08K 3/22* (2006.01)
(Continued)

(52) U.S. Cl.
CPC ......... *C01G 49/0072* (2013.01); *C01G 49/00* (2013.01); *C08K 3/22* (2013.01);
(Continued)

(58) Field of Classification Search
None
See application file for complete search history.

(56) References Cited

U.S. PATENT DOCUMENTS

| 2002/0017628 A1* | 2/2002 | Akimoto ............... H01F 1/36 |
| | | 252/62.56 |
| 2002/0197461 A1 | 12/2002 | Takaya et al. |

(Continued)

FOREIGN PATENT DOCUMENTS

| CN | 1335283 A | 2/2002 |
| EP | 3196168 A1 | 7/2017 |

(Continued)

OTHER PUBLICATIONS

U.S. Appl. No. 16/082,102 to Takashi Kojima et al., filed Sep. 4, 2018.

(Continued)

*Primary Examiner* — Ronak C Patel
(74) *Attorney, Agent, or Firm* — Greenblum & Bernstein, P.L.C.

(57) ABSTRACT

An object of the present invention is to provide ferrite particles having a high magnetic permeability in a frequency band of 1 MHz to 1 GHz. Another object is to provide a resin composition containing the ferrite particles and an electromagnetic wave shielding material composed of the resin composition. The ferrite particles are composed of a single crystalline body having an average particle size of 1 to 2000 nm and has a spherical particle shape, wherein the ferrite particles contain substantially no Zn, 3 to 25 wt % of Mn, and 43 to 65 wt % of Fe, and a real part μ' of a complex magnetic permeability measured using a molding composed of the ferrite particles and a binder resin has a maximal value in a frequency band of 100 MHz to 1 GHz.

5 Claims, 2 Drawing Sheets

(51) Int. Cl.
 *C08K 7/18*     (2006.01)
 *C30B 29/22*    (2006.01)
 *C30B 29/60*    (2006.01)
 *H01F 1/34*     (2006.01)
 *H05K 9/00*     (2006.01)

(52) U.S. Cl.
 CPC ............... *C08K 7/18* (2013.01); *C30B 29/22* (2013.01); *C30B 29/60* (2013.01); *H01F 1/34* (2013.01); *H05K 9/00* (2013.01); *H05K 9/0081* (2013.01); *C01P 2004/04* (2013.01); *C01P 2004/32* (2013.01); *C01P 2004/61* (2013.01); *C01P 2004/62* (2013.01); *C01P 2004/64* (2013.01); *C01P 2006/42* (2013.01); *C08K 2003/2265* (2013.01); *C08K 2201/005* (2013.01); *C08K 2201/01* (2013.01); *C08K 2201/011* (2013.01)

(56) References Cited

U.S. PATENT DOCUMENTS

| | | | |
|---|---|---|---|
| 2009/0053512 A1* | 2/2009 | Pyun | G11B 5/712 428/336 |
| 2010/0193972 A1 | 8/2010 | Yamamoto et al. | |
| 2017/0301443 A1 | 10/2017 | Aga et al. | |

FOREIGN PATENT DOCUMENTS

| | | |
|---|---|---|
| JP | S61-101458 A | 5/1986 |
| JP | H02-021603 A | 1/1990 |
| JP | H02-135711 A | 5/1990 |
| JP | H06-325918 A | 11/1994 |
| JP | H10-064716 A | 3/1998 |
| JP | 2002-025816 A | 1/2002 |
| JP | 2003-104790 A | 4/2003 |
| JP | 2006-335614 | 12/2006 |
| JP | 5690474 B2 | 3/2015 |
| JP | 2015-231928 A | 12/2015 |
| TW | 201612330 A | 4/2016 |

OTHER PUBLICATIONS

U.S. Appl. No. 16/084,420 to Takao Sugiura et al., filed Sep. 12, 2018.
U.S. Appl. No. 16/084,466 to Takao Sugiura et al., filed Sep. 12, 2018.
International Search Report in International Pat. Appl. No. PCT/JP2017/020229, dated Aug. 29, 2017.
TW Office Action issued in TW Patent Application No. 106118495, dated Dec. 28, 2020.
CN Office Action issued in Chinese Patent Application No. 201780032225.7, dated Oct. 12, 2020, English translation.
TW Office Action issued in TW Patent Application No. 106118495, dated Apr. 21, 2020, English translation.
Office Action issued in JP Patent Application No. 2018-522437, dated Jul. 28, 2021, English translation.
Office Action issued in KR Patent Application No. 10-2018-7033648, dated Jul. 26, 2021, English translation.
Office Action issued in KR Patent Application No. 10-2018-7033648, dated Jan. 10, 2022, English translation.

* cited by examiner

[Figure 1]
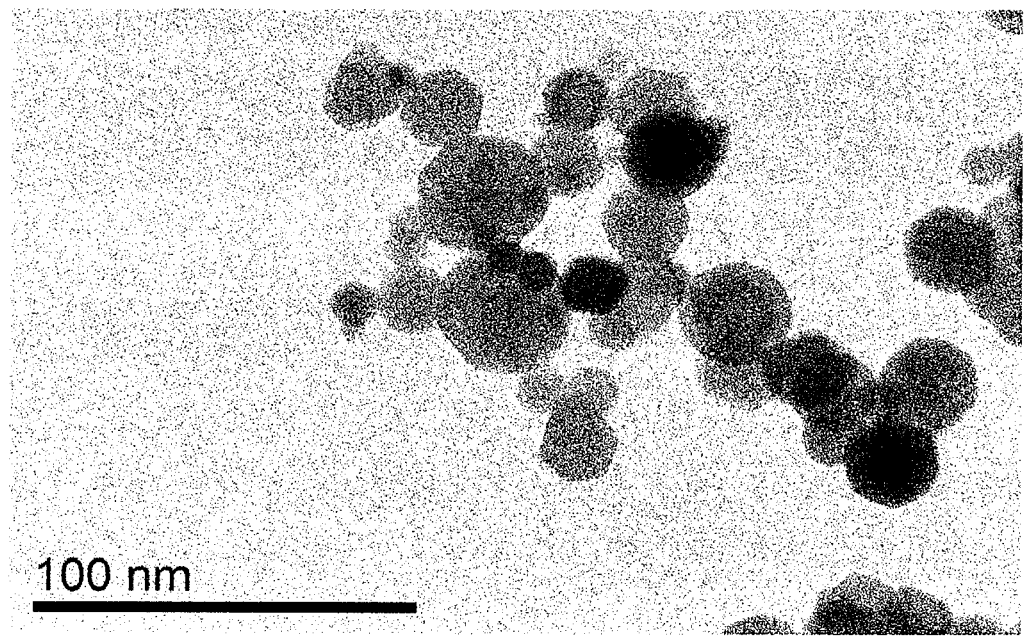
[Figure 2]
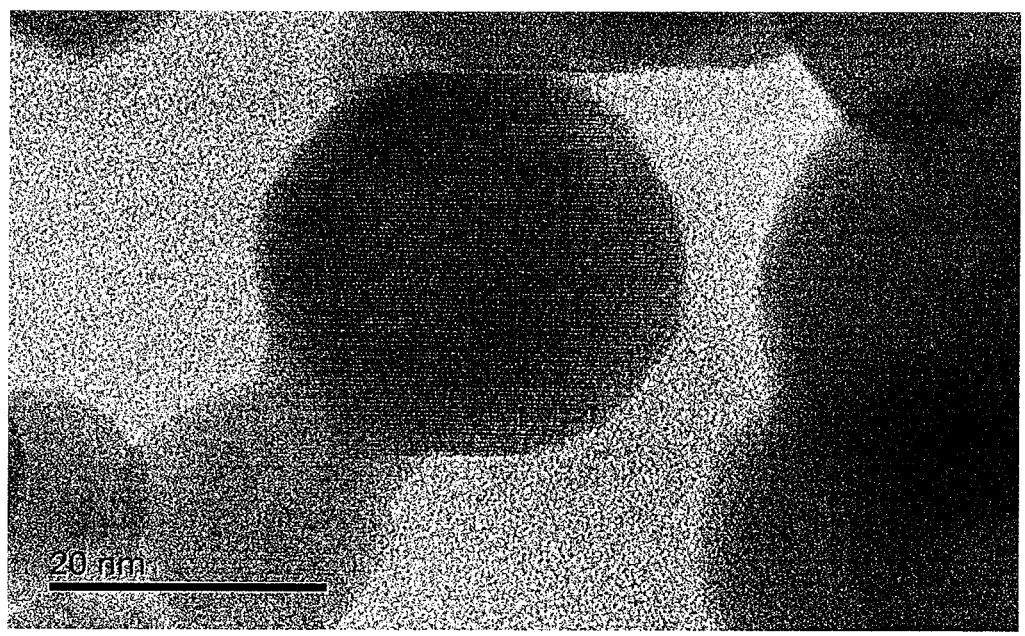

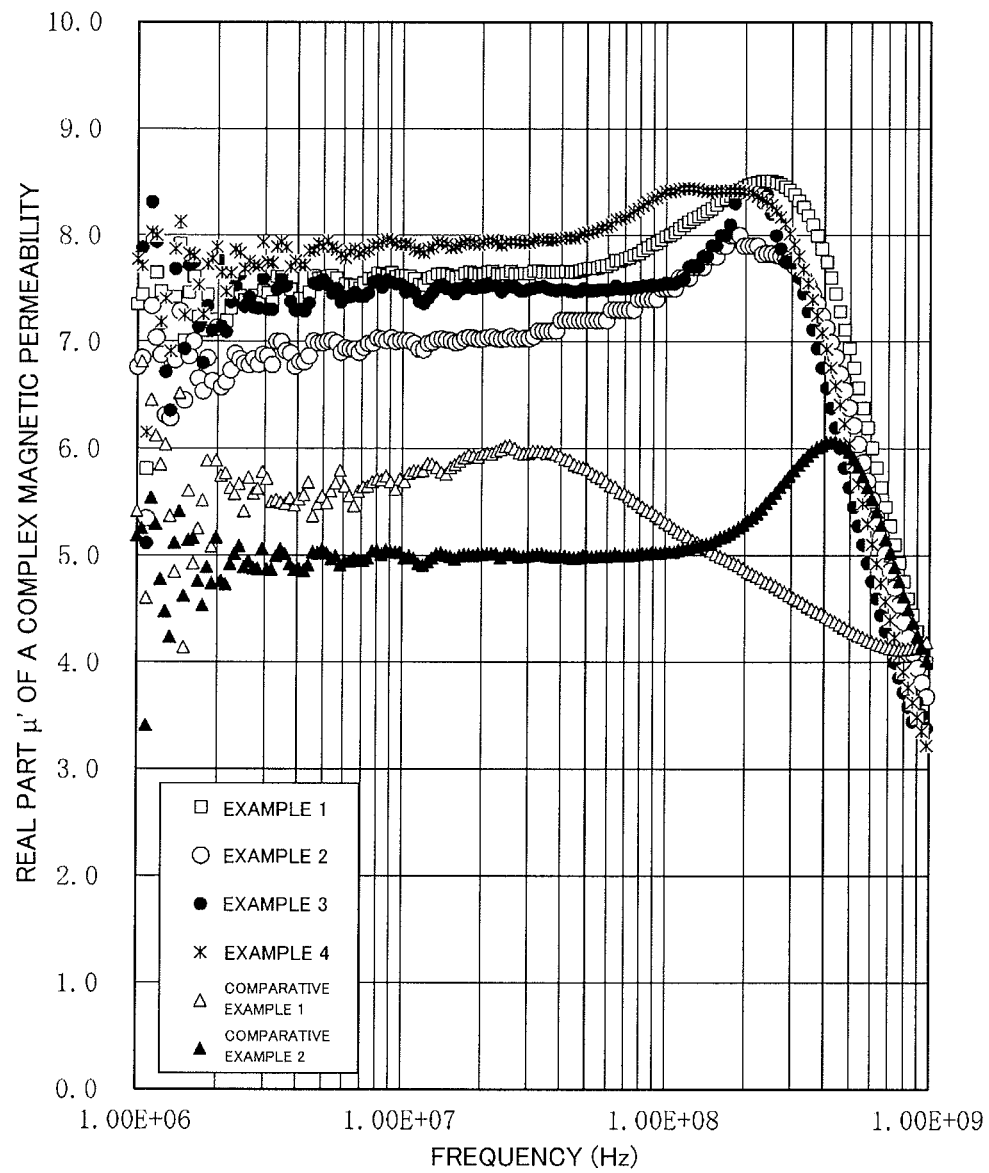
[Figure 3]

FERRITE PARTICLES, RESIN COMPOSITIONS AND ELECTROMAGNETIC WAVE SHIELDING MATERIAL

TECHNICAL FIELD

The present invention relates to ferrite particles, resin compositions containing the ferrite particles and an electromagnetic wave shielding material composed of the resin compositions.

BACKGROUND ART

It has been conventionally known that ferrite particles are sintered to make a sintered compact for use in a magnetic core material, an electromagnetic wave shielding material or the like (for example, refer to Patent Literature 1).

As an electromagnetic wave shielding material using ferrite particles, a resin composition containing ferrite particles formed into a sheet form is considered. Through attachment of an electromagnetic wave shielding material in a sheet form to digital electronic devices such as personal computers and mobile phones that require shielding of electromagnetic waves, leakage of electromagnetic waves to the outside of the electronic devices, mutual interference of electromagnetic waves between internal circuits of an electronic device, and malfunction of the electronic devices due to external electromagnetic waves can be prevented.

It is desired for ferrite particles to be able to shield electromagnetic waves in a wide frequency band for used an electromagnetic wave shielding material for electronic devices. However, no specific numerical values for electromagnetic wave shielding performance are shown at all in Patent Literature 1.

On the other hand, in Patent Literature 2, ferrite particles composed of a single crystalline body having an average particle size of 0.3 μm to 1 μm and having an octahedral particle structure are disclosed, and ferrite particles containing Fe, Mn and Zn are shown. The magnetic permeability measured using a compressed molding composed of a mixture of the ferrite particles disclosed in Patent Literature 2, alkali borosilicate glass powder and polyvinyl alcohol is 1000 or more at a frequency of 1 MHz. However, no electromagnetic wave shielding performance in a frequency band higher than 1 MHz is shown at all in Patent Literature 2.

Further, in Patent Literature 3, ferrite particles composed of a single crystalline body having an average particle size of 0.1 μm to 30 μm and having a spherical particle shape (including polyhedrons similar to a sphere) are disclosed, and ferrite particles containing Fe, Mn and Zn and ferrite particles containing Fe, Ni and Zn are shown. The ferrite particles containing Fe, Mn and Zn disclosed in Patent Literature 3 have, when a relative magnetic permeability μ' (hereinafter referred to as "real part of a complex magnetic permeability μ'") is measured using a compressed molding obtained by adding 10 wt % of water, a real part of a complex magnetic permeability μ' of 32 to 60 in a frequency band of 1 MHz to 450 MHz, while a real part μ' of 0 in a frequency band of 550 MHz to 1 GHz. As a result, an electromagnetic wave shielding material made from the ferrite particles according to Patent Literature 3 has a problem of incapability of shielding electromagnetic waves in a frequency band of 550 MHz to 1 GHz.

CITATION LIST

Patent Literature

[Patent Literature 1] Japanese Patent No. 5690474
[Patent Literature 2] Japanese Patent Laid-Open No. H 6-325918
[Patent Literature 3] Japanese Patent Laid-Open No. 2002-25816

SUMMARY OF INVENTION

Technical Problem

An object of the present invention is to provide ferrite particles having a high magnetic permeability in a frequency band of 1 MHz to 1 GHz. Another object of the present invention is to provide a resin composition containing the ferrite particles, and a magnetic wave shielding material composed of the resin composition.

Solution to Problem

The ferrite particles of the present invention are composed of a single crystalline body having an average particle size of 1 to 2000 nm and has a spherical particle shape, wherein the ferrite particles comprise substantially no Zn, 3 to 25 wt % of Mn, and 43 to 65 wt % of Fe, and a real part μ' of a complex magnetic permeability measured using a molding composed of the ferrite particles and a binder resin has a maximal value in a frequency band of 100 MHz to 1 GHz.

Preferably, the ferrite particles of the present invention further comprise 0 to 3.5 wt % of Mg.

Preferably, the ferrite particles of the present invention further comprise 0 to 1.5 wt % of Sr.

The resin composition of the present invention comprises the ferrite particles as a filler.

The electromagnetic wave shielding material of the present invention is composed of the resin composition.

Advantageous Effect of Invention

For the ferrite particles of the present invention, a real part μ' of a complex magnetic permeability measured using the molding has a maximal value in a frequency band of 100 MHz of 1 GHz so that the real part μ' is more than 0 not only in a frequency band of 1 MHz to 100 MHz, but also in a frequency band higher than the frequency at which the maximal value occurs and close to 1 GHz. As a result, according to the ferrite particles of the present invention, a high magnetic permeability can be obtained in a frequency band of 1 MHz to 1 GHz.

Further, the ferrite particles of the present invention can be contained as a filler in resin compositions. Further, the resin composition containing the ferrite particles as a filler can be used as an electromagnetic wave shielding material. The electromagnetic wave shielding material can shield the electromagnetic waves in a frequency band of 1 MHz to 1 GHz due to use of the ferrite particles.

BRIEF DESCRIPTION OF DRAWINGS

FIG. 1 is a transmission electron micrograph (magnification: 100000) of the ferrite particles in Example 1.

FIG. 2 is a transmission electron micrograph (magnification: 500000) of the ferrite particles in Example 1.

FIG. 3 is a graph showing the frequency dependence of the real part µ' of a complex magnetic permeability of the ferrite particles in Examples 1 to 4 and Comparative Examples 1 to 2.

DESCRIPTION OF EMBODIMENT

The embodiment of the present invention will be described below.

<Ferrite Particles of the Present Invention>

The ferrite particles of the present invention are composed of a single crystalline body having an average particle size of 1 to 2000 nm and having a spherical particle shape. The ferrite particles can have a high magnetic permeability in a frequency band of 1 MHz to 1 GHz. The magnetic permeability can be represented by the real part µ' of a complex magnetic permeability.

The spherical shape as referred to herein means a shape having an average degree of sphericity of 1 to 1.2, preferably 1 to 1.1, and further preferably as close to 1 as possible. When the average degree of sphericity exceeds 1.2, the sphericity of the ferrite particles is impaired.

(Average Degree of Sphericity)

The degree of sphericity can be obtained as follows. First, ferrite particles are photographed by a scanning electron microscope FE-SEM (SU-8020 manufactured by Hitachi High-Technologies Corporation) with a magnification of 200000. On this occasion, 100 or more of the ferrite particles are countable in the visual field photographed. The photographed SEM image is subjected to image analysis by using an image analysis software (Image-Pro PLUS, produced by Media Cybernetics). The circumscribed circle diameter and the inscribed circle diameter of each of the particles are manually measured to define the ratio thereof (circumscribed circle diameter/inscribed circle diameter) as the degree of sphericity. In the case where the two diameters are the same, i.e., in the case of a perfect sphere, the ratio is 1. In the present embodiment, the average of the degree of sphericity of 100 ferrite particles is defined as the average degree of sphericity.

(Average Particle Size)

The ferrite particles of the present invention have an average particle size of 1 to 2000 nm. With an average particle size of less than 1 nm, the particles aggregate even when subjected to surface treatment, so that excellent dispersibility in a resin, a solvent, or a resin composition cannot be obtained. Meanwhile, with an average particle size of more than 2000 nm, the maximal value of the real part µ' of the complex magnetic permeability is absent in a frequency band of 100 MHz to 1 GHz, and present in a frequency band of less than 100 MHz. Further, although the dispersibility can be secured, the presence of the ferrite particles in a ferrite particle-containing molding may cause irregularities in the surface of the molding in some cases. The average particle size of the ferrite particles is preferably 1 to 800 nm, more preferably 1 to 500 nm, further preferably 1 to 350 nm, most preferably 1 to 130 nm.

For example, the average of horizontal Feret diameters manually measured from an image photographed with a magnification of 200000 in the same manner as in the measurement of the average degree of sphericity can be regarded as the average particle size of ferrite particles.

(Crystalline Form)

The ferrite particles of the present invention are composed of a single crystalline body. In the case of ferrite particles are composed of a polycrystalline body, fine pores are generated in crystal grain boundaries in a microstructure within a particle in the crystal growth process during sintering. Consequently, when the ferrite particles are mixed with a resin, a solvent, or a resin composition, the resin composition or the like attempts to penetrate into the pores, so that it may take a long time for the ferrite particles and the resin composition or the like to be uniformly dispersed in some cases. Further, an excessive amount of resin, solvent or resin composition is required depending on conditions, resulting in a drawback in cost. In contrast, the ferrite particles composed of a single crystalline body eliminate the disadvantage. Further, the ferrite particles of the present invention can achieve a high magnetic permeability due to be composed of a single crystalline body as described below.

(Magnetic Permeability)

In order to shield electromagnetic waves having a specific frequency by an electromagnetic shield with use of ferrite particles, a large magnetic permeability is required at that frequency. The magnetic permeability µ is generally expressed by a complex magnetic permeability: $\mu=\mu'-\mu''$ (j: imaginary unit). The real part µ' of a complex magnetic permeability represents a normal magnetic permeability component and the imaginary part µ" represents a loss. Consequently, in order to shield electromagnetic waves having a specific frequency, the real part µ' of a complex magnetic permeability is required to have a certain value more than 0.

The real part µ' of a complex magnetic permeability of the ferrite particles of the present invention has a maximal value in a frequency band of 100 MHz to 1 GHz, preferably in a frequency band of 100 MHz to 300 MHz. Consequently, the real part µ' has a value more than 0 not only in a frequency band of 1 MHz to 100 MHz, but also in a frequency band higher than the frequency at which the maximal value occurs and close to 1 GHz. As a result, according to the ferrite particles of the present invention, a high magnetic permeability can be obtained in a frequency band of 1 MHz to 1 GHz. An electromagnetic wave shielding material made from the ferrite particles, therefore, are able to shield electromagnetic waves in a frequency band of 1 MHz to 1 GHz.

Specifically, the real part µ' of a complex magnetic permeability of the ferrite particles of the present invention has a maximal value in a frequency band of 100 MHz to 300 MHz, the maximal value being in a range of 7 to 9. In a frequency band (1 MHz to 50 MHz) lower than the frequency at which the maximal value occurs, the real part µ' is in a range of 6 to 8, which is smaller than the maximal value. In a frequency band (400 MHz to 1 GHz) higher than the frequency at which the maximal value occurs, the real part µ' is in a range of 3 to 7, which is smaller than the maximal value, though not reaching 0. Namely, the real part µ' of a complex magnetic permeability of the ferrite particles of the present invention is in a range of 3 to 9 in a frequency band of 100 MHz to 1 GHz, and always larger than 0 in a frequency band of 100 MHz to 1 GHz, so that a high magnetic permeability can be achieved.

In contrast, in the case where the real part µ' reaches 0 in a frequency band higher or lower than the frequency at which the maximal value occurs, an electromagnetic wave shielding material made from the ferrite particles is incapable of shielding electromagnetic waves in a frequency band at which the real part µ' reaches 0.

The ferrite particles of the present invention are composed of a single crystalline body, so that a high magnetic permeability can be achieved at a relatively high frequency. In the case of ferrite particles composed of a polycrystalline body, when a magnetic field is applied, magnetic domains move through a plurality of grains. On this occasion, a force acts to prevent the migration of the magnetic domain in the case where each of the grains has a different crystal orientation. Consequently, ferrite particles composed of a polycrystalline body have a worsened rise of the magnetic permeability. In contrast, in the case of single crystalline ferrite particles, no such force caused by grains acts to prevent the migration of a magnetic domain, so that a high magnetic permeability can be achieved.

The real part $\mu'$ of a complex magnetic permeability can be measured as follows. A mixture of 90 parts by weight of ferrite particles and 10 parts by weight of a powdered binder resin packed into a die is compressed to make a molding as a sample, which is measured by an RF impedance/material analyzer E4991A with electrodes for measuring magnetic material 16454A, manufactured by Agilent Technologies, Inc.

(Composition)

The ferrite particles of the present invention are composed of metal oxides containing 3 to 25 wt % of Mn and 43 to 65 wt % of Fe. Note that the ferrite particles of the present invention contain substantially no Zn. The ferrite particles of the present invention are made of soft ferrite composed of metal oxides containing substantially no Zn and Mn and Fe in the content ranges described above, so that both of a high magnetic permeability and a low residual magnetization can be achieved. The ferrite particles of the present invention may further contain 0 to 3.5 wt % of Mg in addition to Mn and Fe. With addition of Mg in the content range described above, an effect of expanding the width (peak width) of the maximal value of the real part $\mu'$ of a complex magnetic permeability can be obtained, which is preferable.

Note that an expression "containing substantially no Zn" is described to make it clear that the ferrite particles contain no Zn positively added, and may contain Zn as inevitable impurities. In analysis of the ferrite particles, the Zn content is therefore at a trace level.

With a Mn content of less than 3 wt %, a desired magnetic permeability may not be obtained in some cases. Further, the residual magnetization of ferrite particles increases to cause aggregation of ferrite particles easily, so that it becomes difficult to disperse the ferrite particles uniformly in a resin, a solvent, or a resin composition in that case. Meanwhile, with a Mn content of more than 25 wt %, a desired magnetic permeability may not be obtained, or a desired saturation magnetization required for ferrite particles may not be obtained in some cases.

With a Fe content of less than 43 wt %, a desired magnetic permeability of ferrite particles may not be obtained in some cases. Meanwhile, with a Fe content of more than 65 wt %, the residual magnetization of ferrite particles increases to cause aggregation of ferrite particles easily in some cases. In that case, it becomes difficult to disperse the ferrite particles uniformly in a resin, a solvent, or a resin composition.

The ferrite particles of the present invention may contain Sr in addition to the composition described above. Containing Sr enables not only easy adjustment of the uniformity during sintering but also easy fine adjustment of the frequency properties of ferrite particles. The Sr content is preferably 0 to 1.5 wt %. With a Sr content of more than 1.5 wt %, an effect of hard ferrite may begin to reduce the magnetic permeability.

(BET Specific Surface Area)

Preferably, the ferrite particles of the present invention have a BET specific surface area of 1 to 30 m$^2$/g. With a BET specific surface area of less than 1 m$^2$/g, the affinity between the particle surface and a resin composition containing the ferrite particles is insufficient in the resin composition, so that the resin composition present in the particle surface may locally swell in some cases. As a result, irregularities may be formed on the surface of a molding made from the resin composition in some cases, which is undesirable. Meanwhile, ferrite particles composed of Fe, Mn, Mg and Sr allow a smooth surface to be formed in many cases, never having a BET specific surface area of more than 30 m$^2$/g. More preferably, ferrite particles have a BET specific surface area of 5 to 20 m$^2$/g.

(Saturation Magnetization)

Preferably, the ferrite particles of the present invention have a saturation magnetization of 45 to 95 Am$^2$/kg. The saturation magnetization is measured by applying a magnetic field of 5K·1000/4$\pi$·A/m to the ferrite particles filled in a predetermined cell using magnetic measuring device. Incidentally, in the present specification, the saturation magnetization measured in this way is referred to as "saturation magnetization". Ferrite particles with a saturation magnetization in the range described above are suitable for use as a magnetic core material. With a saturation magnetization of less than 45 Am$^2$/kg, the performance is insufficient as a magnetic core material. Meanwhile, it is difficult for ferrite particles composed of Fe, Mn, Mg and Sr to achieve a saturation magnetization of more than 95 Am$^2$/kg.

(Residual Magnetization)

Preferably, the ferrite particles of the present invention have a residual magnetization of 0 to 12 Am$^2$/kg. With a residual magnetization in the above range, the dispersibility in a resin, a solvent, or a resin composition can be more surely obtained. With a residual magnetization of more than 12 Am$^2$/kg, aggregation of the ferrite particles may occur easily, so that it becomes difficult to disperse the ferrite particles uniformly in a resin, a solvent, or a resin composition in some cases.

<Method for Manufacturing Ferrite Particles>

The method for manufacturing the ferrite particles is described as follows.

The ferrite particles described above can be manufactured by thermally spraying granulated products composed of the raw material of ferrite in air atmosphere for ferritization, by rapidly cooling and solidifying it, and then by collecting particles having a particle size in a specified range only.

The method for preparing the raw material of ferrite is not particularly limited, and a conventionally known method including a dry method and a wet method may be employed.

One example of the method for preparing the raw material of ferrite (granulated product) is as follows. Appropriate amounts of raw material Fe, raw material Mn, and, if required, raw material Mg and raw material Sr each are weighed, such that a desired ferrite composition is obtained. Water is then added to the raw materials, and the mixture is pulverized to make a slurry. The prepared slurry is granulated by a spray dryer, so that a granulated product having a desired particle size is prepared through classification. Preferably, the particle size of the granulated product is about 500 to 10000 nm, considering the particle size of the ferrite particles to be obtained. In another example of the method, raw materials of ferrite having a prepared composition are mixed and subjected to dry pulverization, so that each of the raw materials are pulverized and dispersed. The mixture is granulated by a granulator, so that a granulated product having a desired particle size is prepared through classification.

The granulated product thus prepared is thermally sprayed in air atmosphere for ferritization. In thermal spraying, a mixed gas of a combustible gas and oxygen can be used for the combustible gas flame, with a volume ratio between the combustion gas and oxygen of 1:3.5 to 6.0. With a ratio of oxygen to a combustion gas in the combustible gas flame of less than 3.5, insufficient melting may occur in some cases, while with a ratio of oxygen to a combustion gas of more than 6.0, ferritization hardly occurs. For example, the ratio of 35 to 60 $Nm^3$/hr of oxygen to 10 $Nm^3$/hr of combustion gas may be employed.

Examples of the combustion gas for use in the thermal spraying include propane gas, propylene gas, and acetylene gas, and, in particular, propane gas is suitably used. In order to transport the granulated product during burning of the combustible gas, nitrogen, oxygen or air may be used as a gas for transporting the granulated product. Preferably, the granulated product is transported at a flow velocity of 20 to 60 m/sec. The thermal spraying is performed at a temperature of, preferably 1000 to 3500° C., more preferably 2000 to 3500° C.

Subsequently, the ferrite particles obtained through ferritization by thermal spraying are transported in a state of riding on an air flow due to air supplied in the air atmosphere so as to be rapidly cooled and solidified. Then, ferrite particles having an average particle size of 1 to 2000 nm are captured and collected. Since the ferrite particles obtained through ferritization are rapidly cooled and solidified, ferrite particles composed of a single crystalline body can be obtained.

The capturing may be performed by the following method. The rapidly cooled and solidified ferrite particles are transported on an air flow with air supplied, so that ferrite particles having a large particle size fall in mid-stream, other particles are transported to the downstream on the air stream. Ferrite particles having a particle size in the range are captured with a filter provided downstream of the air stream.

The flow velocity during transportation on the air stream is set at 20 to 60 m/sec, so that the ferrite particles having a large particle size fall in mid-stream, and the ferrite particles having a particle size in the above range can be efficiently collected downstream of the air stream. With a flow velocity of less than 20 m/sec, even particles having a small particle size fall in mid-stream, so that the ferrite particles collected downstream of the air stream have an average particle size of less than 1 nm, or the absolute amount of the ferrite particles collected downstream of the air stream is reduced, resulting in a low productivity in some cases. Meanwhile, with a flow velocity of more than 60 m/sec, even particles having a large particle size are transported on the air stream to the downstream, so that the ferrite particles collected downstream of the air stream have an average particle size of more than 2000 nm, in some cases.

If required, the collected ferrite particles are then classified to obtain a desired particle size through particle size control. As the classification method, a conventional method such as classification by wind force, mesh filtration, and settling may be employed. For example, ferrite particles having a large particle size of more than 2000 nm may be removed through classification.

Preferably, the obtained ferrite particles undergo a surface treatment with a coupling agent. Through the surface treatment with a coupling agent, the dispersibility of the ferrite particles in a resin, a solvent, or a resin composition can be further improved. Examples of the coupling agent for use include various silane coupling agents, titanate coupling agents, and aluminate coupling agents. More preferably, decyltrimethoxysilane and n-octyltriethoxysilane may be used. The amount in terms of silane coupling agent for the surface treatment is preferably 0.05 to 4 wt %, more preferably 0.05 to 2 wt %, relative to ferrite particles, depending on the BET specific surface area of the ferrite particles.

<Use of Ferrite Particles of the Present Invention>

The ferrite particles of the present invention may be used, for example, in an electromagnetic wave shielding material. First, the ferrite particles are added to a resin composition containing a resin and an aqueous solvent or an organic solvent-based solvent. The mixture is stirred and mixed, so that the ferrite particles are dispersed in the resin composition. As described above, the ferrite particles are composed of metal oxides containing substantially no Zn, 3 to 25 wt % of Mn, and 43 to 65 wt % of Fe, so that aggregation in a resin composition can be prevented due to the small residual magnetization. Subsequently, the filler-containing resin composition thus obtained is applied on a substrate, and the solvent is evaporated and the resin is cured to make an electromagnetic wave shielding material. Alternatively, the resin composition in a sheet form may be affixed to a printed wiring board or a wiring pattern which requires electromagnetic shielding so as to compose an electromagnetic shielding material.

Containing the ferrite particles of which the real part μ' of a complex magnetic permeability has a maximal value in a frequency band of 100 MHz to 1 GHz, the electromagnetic wave shielding material is able to shield electromagnetic waves in a frequency band of 1 MHz to 1 GHz. Further, since the electromagnetic wave shielding material suppresses the aggregation of ferrite particles in a resin composition, not only performance for uniformly shielding electromagnetic waves over the entire electromagnetic wave shielding material but also a smooth surface can be obtained.

The ferrite particles of the present invention are able to be used in various applications, not being limited to electromagnetic wave shielding materials. The ferrite particles may be used as a magnetic core material and a filler, particularly as a magnetic filler, or may be used as a raw material of a molding. In use of the ferrite particles as a raw material for molding, processes such as molding, granulation, coating, and sintering may be performed.

The present invention is specifically described with reference to Examples as follows.

EXAMPLE

1. Manufacturing of Ferrite Particles

Example 1

Iron oxide ($Fe_2O_3$) and manganese oxide (MnO) were weighed at a molar ratio of 80:20, and mixed. Water was added to the mixture, which was then pulverized to make a slurry having a solid content of 50 wt %. The slurry was granulated by a spray dryer and classified to make a granulated product having an average particle size of 5000 nm.

Subsequently, the granulated product thus obtained was thermally sprayed in the combustible gas flame, at propane:oxygen=10 $Nm^3$/hr:35 $Nm^3$/hr under conditions with a flow velocity of about 40 m/sec, for ferritization, and subsequently transported on an air flow with air supplied so as to be rapidly cooled in air atmosphere. On this occasion, since the granulated product was thermally sprayed while continuously flowing, the particles after thermal spraying and rapidly cooled were independent without binding with each other. Subsequently, the cooled particles were captured with a filter provided downstream of the air flow. On this occasion, particles having a large particle size fell in mid-stream not to be captured with the filter. The captured particles were then classified to remove coarse powder having a particle size of more than 2000 nm. The ferrite particles were thus obtained. As a result, the obtained ferrite particles had a maximum particle size of 2000 nm or less.

Example 2

In the present Example, ferrite particles were manufactured in the same manner as in Example 1, except that the molar ratio between iron oxide and manganese oxide was set at 50:50.

Example 3

In the present Example, ferrite particles were manufactured in the same manner as in Example 1, except that the molar ratio between iron oxide and manganese oxide was set at 90:10.

Example 4

In the present Example, ferrite particles were manufactured in exactly the same manner as in Example 1, except that a mixture was obtained at a molar ratio among iron oxide ($Fe_2O_3$), manganese oxide (MnO), magnesium oxide (MgO), and strontium oxide (SrO) of 50:40:10:1.25.

Comparative Example 1

In the present Comparative Example, after a granulated product was obtained in the same manner as in Example 1, the obtained granulated product was accommodated in a sagger, and sintered in an electric furnace at 1200° C., for 4 hours, under a nitrogen atmosphere with an oxygen content of 0 vol % for ferritization, so that a lump of sintered product corresponding to the shape of the sagger was obtained. The sintered product thus obtained was rapidly cooled in air atmosphere, and the cooled sintered product was milled and pulverized in a mortar, so that ferrite particles were manufactured.

Comparative Example 2

In the present Comparative Example, ferrite particles were manufactured in the same manner as in Example 1, except that the molar ratio between iron oxide and manganese oxide was set at 100:0.

2. Evaluation Method of Ferrite Particles

The ferrite particles obtained in Examples 1 to 4 and Comparative Examples 1 to 2 were subjected to chemical analysis in conjunction with evaluation on powder properties/magnetic properties (shape, crystalline form, average particle size, BET specific surface area, saturation magnetization, residual magnetization and magnetic permeability). The measuring methods for chemical analysis, BET specific surface area, magnetic properties, resistivity and magnetic permeability are as follows, and other measuring methods are as described above. Results are shown in Tables 1 to 2.

(Chemical Analysis: Content of Fe, Mn, Mg and Sr)

The content of Fe, Mn, Mg and Sr in ferrite particles was measured as described below. First, weighed 0.2 g of ferrite particles were completely dissolved in 60 ml of pure water with addition of 20 ml of 1 N hydrochloric acid and 20 ml of 1 N nitric acid by heating to prepare an aqueous solution. The obtained aqueous solution was set in an ICP analyzer (ICPS-1000IV manufactured by Shimadzu Corporation) to measure the content of metal components in the ferrite particles. Incidentally, a notation "<0.01" in Table 1 means a measurement error or presence of inevitable impurities.

(Shape)

The average degree of sphericity was measured by the method described above. In the case of an average degree of sphericity of 1.2 or less, the shape was determined as "spherical".

(Crystalline Form)

The ferrite particles in Example 1 were observed by a transmission electron microscopic (TEM) at magnifications of 100000 and 500000. The obtained photographs are shown in FIGS. 1 and 2.

(Average Particle Size)

The horizontal Feret diameter described above was used as the average particle size of ferrite particles in Examples 1 to 4, and the following volume average particle size was used as the average particle size of ferrite particles in Comparative Examples 1 to 2.

(Volume Average Particle Size)

The volume average particle size was measured by a Microtrac particle size analyzer (Model 9320-X100, manufactured by Nikkiso Co., Ltd.). First, 10 g of the obtained ferrite particles were put in a beaker together with 80 ml of water as dispersion medium, and 2 to 3 drops of aqueous sodium hexametaphosphate as dispersant were added thereto. Subsequently, the ferrite particles were dispersed in the solution by oscillation of an ultrasonic homogenizer (UH-150, manufactured by SMT Co., Ltd.) at an output level of 4 for 20 seconds. Subsequently, after removal of the foams generated on the surface of the solution in the beaker, solid-liquid separation was performed to collect the ferrite particles. The volume average particle size of the collected ferrite particles was measured.

(BET Specific Surface Area)

The BET specific surface area was measured by using an apparatus for measuring specific surface area (Macsorb HM model-1208, manufactured by Mountech Co., Ltd.). First, about 10 g of the obtained ferrite particles were placed on a medicine paper, and heated at 200° C. for 2 hours after confirmation of the vacuum degree reaching −0.1 MPa or lower through deaeration by a vacuum dryer, so that the moisture adhering to the surface of the ferrite particles was removed. Subsequently, about 0.5 to 4 g of the ferrite particles with moisture removed was placed in a standard sample cell dedicated to the apparatus so as to be accurately weighed by a precision balance. Subsequently, the weighed ferrite particles were set in a measuring port of the apparatus so as to be measured. The measurement was performed by a one-point method. The atmosphere for the measurement was at a temperature of 10 to 30° C. and a relative humidity of 20 to 80% (without dew condensation).

(Magnetic properties) The magnetic properties were measured by a vibrating sample magnetometer (VSM-C7-10A, manufactured by Toei Industry Co., Ltd.). First, a cell having an inner diameter of 5 mm and a height of 2 mm was filled with the obtained ferrite particles, and set in the apparatus described above. In the apparatus, a magnetic field was applied and swept to 5K·1000/4π·A/m. Subsequently, the applied magnetic field was reduced, so that a hysteresis curve was made on a recording paper. In the curve, a magnetization in response to an applied magnetization of 5K·1000/4π·A/m was regarded as the saturation magnetization, and a magnetization in response to an applied magnetization of 0K·1000/4πA/m was regarded as the residual magnetization.

(Magnetic Permeability) The magnetic permeability was measured by using an RF impedance/material analyzer E4991A with electrodes for measuring magnetic material 16454A, manufactured by Agilent Technologies, Inc. First, 9 g of ferrite particles and 1 g of a binder resin (Kynar 301F: polyvinylidene fluoride) were accommodated in a 100-cc polyethylene container and stirred and mixed by a ball mill at 100 rpm for 30 minutes. After completion of stirring, about 0.6 g of the mixture was packed into a die with an inner diameter of 4.5 mm and an outer diameter of 13 mm so as to be compressed under a pressure of 40 MPa for 1 minute with a pressing machine, so that a molding with a height of about 1.8 mm was obtained. The obtained molding was thermally cured at 140° C. for 2 hours by a hot air dryer to obtain a sample to be measured.

The sample to be measured was set in the measuring apparatus, and the pre-measured outer diameter, inner diameter and height of the sample to be measured were inputted to the measuring apparatus. In the measurement, the amplitude was set at 100 mV, and the sweeping was performed in a frequency range from 1 MHz to 1 GHz to measure the real part μ' of a complex magnetic permeability. The obtained graph is shown in FIG. 3. Note that the horizontal axis of the graph is a logarithmic scale value.

sion image in FIG. 2, crystal planes oriented in the same direction with a striped pattern were observed in the internal part of a particle, so that it is apparent that the ferrite particle in Example 1 was in a single crystalline body. Also, the same results were obtained on the ferrite particles in Examples 2 to 4.

In contrast, the ferrite particles in Comparative Example 1 contain Fe and Mn as in Examples 1 to 3, but contain substantially no Mg, Sr and Zn. The ferrite particles in Comparative Example 1 were in a polycrystalline body with an average particle size of more than 2000 nm, having an amorphous particle shape, not being in a spherical form, and a BET specific surface area of less than 1 m$^2$/g. Also, the ferrite particles in Comparative Example 2 were in a single crystalline body with an average particle size of less than 2000 nm, having a spherical particle shape and a BET specific surface area in a range of 1 to 30 m$^2$/g, as in Examples 1 to 4.

Further, as shown in FIG. 3, the maximal value of the real part μ' of a complex magnetic permeability of the ferrite particles in Examples 1 to 4 was present in a frequency band of 100 MHz to 300 MHz, and the maximal value of the real

TABLE 1

| | Molar ratio in preparation | | | | | | Chemical analysis (ICP) (wt %) | | | | |
|---|---|---|---|---|---|---|---|---|---|---|---|
| | Fe$_2$O$_3$ | MnO | MgO | SrO | ZrO | Manufacturing method | | Fe | Mn | Mg | Sr | Zn |
| Example 1 | 80 | 20 | 0 | 0 | 0 | Thermal spraying | Capture with filter | 62.07 | 8.24 | <0.01 | <0.01 | <0.01 |
| Example 2 | 50 | 50 | 0 | 0 | 0 | Thermal spraying | Capture with filter | 58.93 | 19.43 | <0.01 | 0.03 | <0.01 |
| Example 3 | 90 | 10 | 0 | 0 | 0 | Thermal spraying | Capture with filter | 63.96 | 4.28 | 0.05 | <0.01 | <0.01 |
| Example 4 | 50 | 40 | 10 | 1.25 | 0 | Thermal spraying | Capture with filter | 49.00 | 19.28 | 2.13 | 0.96 | <0.01 |
| Comparative Example 1 | 80 | 20 | 0 | 0 | 0 | Electric furnace | Pulverization | 63.07 | 7.96 | <0.01 | <0.01 | <0.01 |
| Comparative Example 2 | 100 | 0 | 0 | 0 | 0 | Thermal spraying | Capture with filter | 65.86 | 0.31 | 0.08 | <0.01 | <0.01 |

| | Powder properties/Magnetic properties | | | | | |
|---|---|---|---|---|---|---|
| | Shape | Crystal form | Average particle size (nm) | BET specific surface area (m$^2$/g) | Saturation magnetization *1 (Am$^2$/kg) | Residual magnetization *2 (Am$^2$/kg) |
| Example 1 | Spherical | Single crystal | 98 | 10.33 | 75.9 | 8.9 |
| Example 2 | Spherical | Single crystal | 43 | 18.2 | 60.6 | 7.2 |
| Example 3 | Spherical | Single crystal | 281 | 8.23 | 71.3 | 9.8 |
| Example 4 | Spherical | Single crystal | 48 | 29.1 | 50.3 | 11.5 |
| Comparative Example 1 | Irregular | Polycrystal | 5564 | 0.56 | 85.6 | 20.0 |
| Comparative Example 2 | Spherical | Single crystal | 895 | 15.05 | 64.1 | 12.1 |

*1 Magnetization at 5K · 1000/4π · A/m
*2 Magnetization at 0K · 1000/4π · A/m

5. Evaluation Results on Ferrite Particle

As shown in FIG. 1, the ferrite particles in Examples 1 to 3 contain Fe and Mn, with substantially no content of Mg, Sr and Zn. The ferrite particles in Example 4 contain Fe, Mn, Mg and Sr, with substantially no content of Zn. The ferrite particles in Examples 1 to 4 have an average particle size in a range of 1 to 2000 nm, and a BET specific surface area in a range of 1 to 30 m/g.

As shown in FIG. 1, the ferrite particles in Example 1 had a spherical shape. Further, as shown in the TEM transmispart μ' was in a range of 7 to 9. Further, in the frequency band of 1 MHz to 50 MHz, the real part μ' was in a range of 6 to 8, which was smaller than the maximal value, and in the frequency band of 400 MHz to 1 GHz, the real part μ' was in a range of 3 to 7, which was smaller than the maximal value, not having reached 0.

In contrast, the maximal value of the real part μ' of a complex magnetic permeability of the ferrite particles in Comparative Example 1 was present at a frequency of about 20 MHz, and the maximal value was about 7. Further, in a frequency band of 1 MHz to 10 MHz, the real part μ' was in a range of 5 to 6.5. Also, the maximal value of the real part μ' of a complex magnetic permeability of the ferrite particles in Comparative Example 2 was present in a frequency band of 350 MHz to 500 MHz, and the maximal value was about 6.2. Further, the real part μ' in a frequency band of 1 MHz to 100 MHz was in a range of 4 to 5.5.

As described above, the ferrite particles in Examples 1 to 4 had a real part μ' of a complex magnetic permeability larger than the real part μ' of a complex magnetic permeability of the ferrite particles in Comparative Examples 1 to 2 over an entire frequency band of 1 MHz to 500 MHz. Further, although the ferrite particles in Examples 1 to 4 had a smaller real part μ' than the ferrite particles in Comparative Examples 1 to 2 in a frequency band of 700 MHz to 1 GHz, there was no large difference from those in Comparative Examples 1 to 2. Consequently, it is apparent that the ferrite particles in Examples 1 to 4 exhibit a better magnetic permeability in a frequency band of 1 MH to 1 GHz than the ferrite particles in Comparative Examples 1 to 2.

INDUSTRIAL APPLICABILITY

According to the ferrite particles of the present invention, use of the particles as a magnetic wave shielding material of electronic devices allows to stably shield electromagnetic waves in a wide frequency band required to be shielded regardless of the frequency. Further, since the ferrite particles have excellent dispersibility in a resin, a solvent, or a resin composition, an electromagnetic wave shielding material in a sheet form made of a resin composition containing the ferrite particles as a filler can prevent the aggregation of ferrite particles on the surface of the electromagnetic shielding material. Consequently, performance for uniformly shielding electromagnetic waves over an entire electromagnetic wave shielding material can be obtained together with a smooth surface. Further, the ferrite particles of the present invention can also be suitably used as magnetic filler and raw material of a molding.

The invention claimed is:

1. Ferrite particles composed of a single crystalline body having an average particle size of 1 to 2000 nm and having a spherical particle shape, wherein the ferrite particles comprise substantially no Zn, 3 to 25 wt % of Mn, and 43 to 65 wt % of Fe; and a real part μ' of a complex magnetic permeability measured using a molding composed of the ferrite particles and a binder resin has a maximal value above 0 in a frequency band of 100 MHz to 1 GHz.

2. The ferrite particles according to claim 1, further comprising 0.05 to 3.5 wt % of Mg.

3. The ferrite particles according to claim 1, further comprising 0.03 to 1.5 wt % of Sr.

4. A resin composition comprising the ferrite particles according to claim 1 as a filler.

5. An electromagnetic wave shielding material composed of the resin composition according to claim 4.

* * * * *